United States Patent
Ide et al.

(10) Patent No.: US 10,002,989 B2
(45) Date of Patent: Jun. 19, 2018

(54) METHOD FOR PRODUCING A SEMICONDUCTOR LIGHT-EMITTING DEVICE

(71) Applicant: TOYODA GOSEI CO., LTD., Kiyosu-shi (JP)

(72) Inventors: Kimiyasu Ide, Kiyosu (JP); Shingo Totani, Kiyosu (JP)

(73) Assignee: TOYOTA GOSEI CO., LTD., Kiyosu-Shi, Aichi-Ken (JP)

(*) Notice: Subject to any disclaimer, the term of this patent is extended or adjusted under 35 U.S.C. 154(b) by 0 days. days.

(21) Appl. No.: 15/464,134

(22) Filed: Mar. 20, 2017

(65) Prior Publication Data
US 2017/0345971 A1 Nov. 30, 2017

(30) Foreign Application Priority Data
May 30, 2016 (JP) .................. 2016-107307

(51) Int. Cl.
*H01L 33/22* (2010.01)
*H01L 33/00* (2010.01)
(Continued)

(52) U.S. Cl.
CPC .......... *H01L 33/22* (2013.01); *H01L 33/0075* (2013.01); *H01L 33/06* (2013.01); *H01L 33/12* (2013.01); *H01L 33/145* (2013.01); *H01L 33/32* (2013.01); *H01L 33/42* (2013.01); *H01L 33/46* (2013.01)

(58) Field of Classification Search
CPC ....... H01L 33/22; H01L 33/145; H01L 33/46; H01L 33/42; H01L 33/12; H01L 33/32; H01L 33/0075; H01L 33/06
See application file for complete search history.

(56) References Cited

U.S. PATENT DOCUMENTS 9,362,449 B2 6/2016 Kim et al.
2008/0044937 A1* 2/2008 Choi ................ H01L 33/22
438/47
(Continued)

FOREIGN PATENT DOCUMENTS

JP 2015-061010 A 3/2015
JP 2015-509663 A 3/2015

*Primary Examiner* — Jessica Manno
*Assistant Examiner* — Mohammed R Alam
(74) *Attorney, Agent, or Firm* — McGinn IP Law Group, PLLC

(57) ABSTRACT

The present invention provides a method for producing a semiconductor light-emitting device in which fine protrusions and recesses are formed on a bottom surface between the protrusions on a surface of a substrate. The method comprises forming a first resist pattern on a nitrogen surface of the substrate, forming a plurality of first protrusions on the nitrogen surface of the substrate, and forming a plurality of second protrusions on the nitrogen surface of the transparent nitride-based substrate. In forming the first protrusions, the plurality of first protrusions and a bottom surface between the first protrusions are formed by dry etching. In forming the second protrusions, the plurality of second protrusions having a height lower than the height of the first protrusions are formed on the bottom surface by wet etching without removing the first resist pattern subjected to dry etching.

6 Claims, 4 Drawing Sheets

(51) Int. Cl.
*H01L 33/06* (2010.01)
*H01L 33/12* (2010.01)
*H01L 33/14* (2010.01)
*H01L 33/32* (2010.01)
*H01L 33/42* (2010.01)
*H01L 33/46* (2010.01)

(56) References Cited

U.S. PATENT DOCUMENTS

| | | | |
|---|---|---|---|
| 2010/0127295 A1* | 5/2010 | Kim | H01L 33/20 257/98 |
| 2012/0070924 A1* | 3/2012 | Son | H01L 33/007 438/29 |
| 2013/0313596 A1* | 11/2013 | Fu | H01L 33/22 257/98 |
| 2014/0239341 A1* | 8/2014 | Matsumura | H01L 33/36 257/99 |
| 2015/0083992 A1 | 3/2015 | Kanto et al. | |
| 2016/0163937 A1* | 6/2016 | Inoue | H01L 33/22 257/98 |

* cited by examiner

METHOD FOR PRODUCING A SEMICONDUCTOR LIGHT-EMITTING DEVICE

BACKGROUND OF THE INVENTION

Field of the Invention

The present technical field relates to a method for producing a semiconductor light-emitting device exhibiting improved light extraction efficiency.

Background Art

Brightness of the semiconductor light-emitting device depends on the internal quantum efficiency and the light extraction efficiency of the device. Therefore, the techniques have been developed to improve the internal quantum efficiency and the light extraction efficiency of the device. The techniques to form an uneven light extraction surface have been developed to improve the light extraction efficiency.

Japanese Translation of PCT International Application Publication No. 2015-509663 discloses a light-emitting device having a plurality of protrusions 25a on a surface of an n-type semiconductor layer 25 and small cones 25b formed on the top surfaces of the protrusions 25a (refer to paragraph [0037] and FIG. 2). Disclosed is the techniques to form the small cones 25b formed on the top surfaces of the protrusions 25a by wet etching after the protrusions 25a were formed by dry etching (paragraphs [0062] to [0066] and FIGS. 9 to 11).

The semiconductor light-emitting device has a flip chip to extract light from the substrate. In the flip-chip type light-emitting device, an uneven shape may be formed on the light extraction surface formed on the substrate. For example, when forming the uneven shape by etching, a flat surface may be generated between the protrusions. The flat surface between the protrusions reflects light. Therefore, fine protrusions and recesses are preferably formed on the flat surface between the protrusions.

SUMMARY OF THE INVENTION

The present techniques have been conceived for solving the aforementioned problems involved in conventional techniques. Thus, an object of the present techniques is to provide a method for producing a semiconductor light-emitting device that is designed to form fine protrusions and recesses on a bottom surface between the protrusions on the surface of the substrate.

In a first aspect of the present techniques, there is provided a method for producing a semiconductor light-emitting device, the method comprising a resist pattern formation step of forming a first resist pattern on a nitrogen surface of a transparent nitride-based substrate, a first protrusion formation step of forming a plurality of first protrusions on the nitrogen surface of the transparent nitride-based substrate, and a second protrusion formation step of forming a plurality of second protrusions on the nitrogen surface of the transparent nitride-based substrate. In the first protrusion formation step, the plurality of first protrusions and a bottom surface between the first protrusions are formed by dry etching. In the second protrusion formation step, the plurality of second protrusions having a height lower than the height of the plurality of first protrusions are formed on the bottom surface by wet etching without removing the first resist pattern subjected to dry etching. The transparent nitride-based substrate may be made of GaN or AlN.

The method for producing a semiconductor light-emitting device is to form a light extraction surface on a flip-chip type transparent nitride-based substrate. In the production method, fine protrusions and recesses are formed by wet etching on the bottom surface formed by dry etching. Therefore, a light-emitting device exhibiting high light extraction efficiency can be produced. The first resist pattern is used in both dry etching and wet etching. Thus, although etching is performed twice, the number of steps is small.

A second aspect of the present techniques is drawn to a specific embodiment of the method for producing the semiconductor light-emitting device, wherein in the first protrusion formation step, the plurality of first protrusions are formed at a constant pitch interval. In the second protrusion formation step, the plurality of second protrusions are randomly formed.

A third aspect of the present techniques is drawn to a specific embodiment of the method for producing the semiconductor light-emitting device, wherein in the first protrusion formation step and the second protrusion formation step, the plurality of first protrusions are formed at a pitch of 350 nm to 550 nm, the height of the plurality of first protrusions is 200 nm to 400 nm, and the diameter of the plurality of first protrusions at the bottom surface thereof is 150 nm to 350 nm. Moreover, the height of the plurality of second protrusions is 100 nm to 300 nm, and the diameter of the plurality of second protrusions at the bottom surface thereof is 100 nm to 300 nm.

A fourth aspect of the present techniques is drawn to a specific embodiment of the method for producing the semiconductor light-emitting device, wherein the area of the plurality of first protrusions accounts for 50% to 85% of the total area of the nitrogen surface of the transparent nitride-based substrate.

A fifth aspect of the present techniques is drawn to a specific embodiment of the method for producing the semiconductor light-emitting device, the method including a semiconductor layer formation step of forming a semiconductor layer on a surface opposite to the nitrogen surface of the transparent nitride-based substrate.

In the specification, there is provided a method for producing a semiconductor light-emitting device that is designed to form fine protrusions and recesses on the bottom surface between the protrusions on the surface of the substrate.

BRIEF DESCRIPTION OF THE DRAWINGS

Various other objects, features, and many of the attendant advantages of the present techniques will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
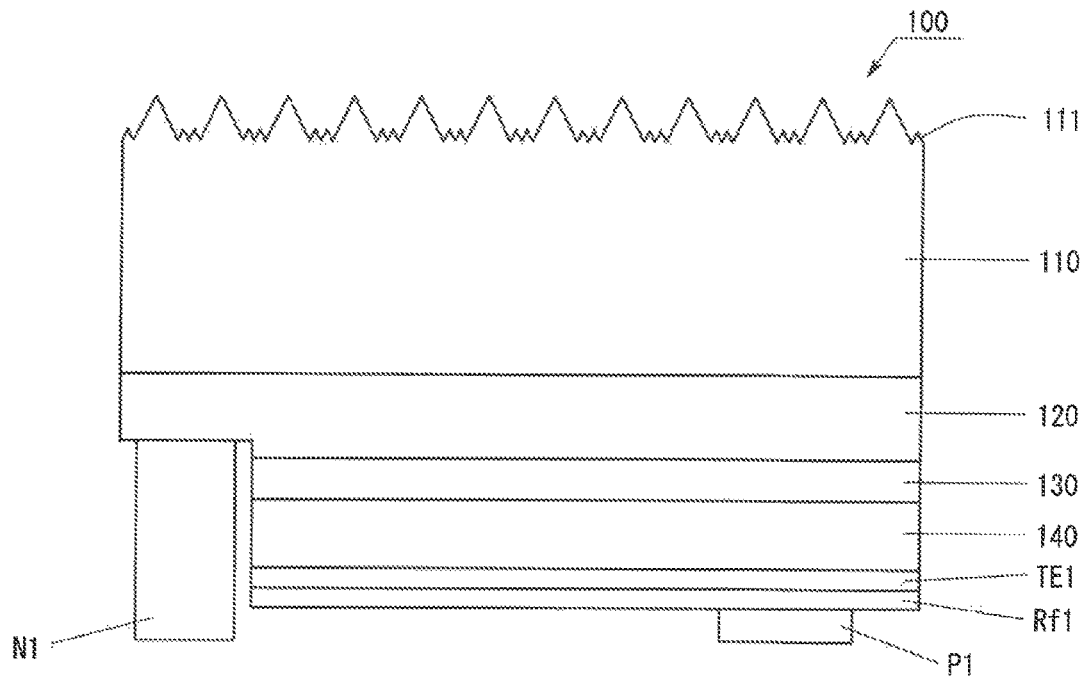
FIG. 1 is a schematic view of the structure of a light-emitting device according to Embodiment 1.

With reference to the drawings, specific embodiment of the production method for producing a semiconductor light-emitting device as an example will next be described in detail. However, this embodiment should not be construed as limiting the techniques thereto. The below-described deposition structure of the layers of the semiconductor light-emitting device and the electrode structure are given only for the illustration purpose, and other deposition structures differing therefrom may also be employed. The thickness of each of the layers shown in the drawings is not an actual value, but a conceptual value.

Embodiment 1

1. Semiconductor Light-Emitting Device

FIG. 1 is a schematic view of the structure of a light-emitting device 100 according to Embodiment 1. The light-emitting device 100 is a flip-chip type semiconductor light-emitting device. Therefore, the light-emitting device 100 emits light from the light extraction surface 111 of the substrate 110. The light-emitting device 100 comprises a plurality of Group III nitride semiconductor layers.

As shown in FIG. 1, the light-emitting device 100 comprises a substrate 110, an n-type semiconductor layer 120, a light-emitting layer 130, a p-type semiconductor layer 140, a transparent electrode TE1, a reflection film Rf1, a p-electrode P1, and an n-electrode N1.

The substrate 110 is a growth substrate for forming a Group III nitride semiconductor layer on a main surface thereof through MOCVD. The substrate 110 is a transparent nitride-based substrate. More specifically, the substrate 110 is made of GaN or AlN. The substrate 110 has a light extraction surface 111. The light extraction surface 111 has a plurality of protrusions and recesses. Moreover, the protrusions and recesses are preferably formed on a surface opposite to the light extraction surface 111 of the substrate 110. Thus, when the front and rear surfaces of the substrate 110 have the uneven shape thereon, the light emitted from the light-emitting layer 130 can appropriately transmit the substrate 110.

The n-type semiconductor layer 120 comprises an n-type contact layer, an n-side electrostatic breakdown preventing layer, and an n-side superlattice layer. The n-type contact layer is a layer in contact with an n-electrode N1. The n-type contact layer is formed on the substrate 110. The n-side electrostatic breakdown preventing layer is a layer for preventing electrostatic breakdown of each semiconductor layer. The n-side electrostatic breakdown preventing layer is formed on the n-type contact layer. The n-side superlattice layer is a layer for relaxing the stress applied to the light-emitting layer 130. The n-side superlattice layer is formed on the n-side electrostatic breakdown preventing layer. The n-side superlattice layer has a superlattice structure. The n-type semiconductor layer 120 may include an ud-GaN layer not doped with a donor.

The light-emitting layer 130 is a layer for emitting light by recombination of electrons and holes. The light-emitting layer 130 is formed on the n-side superlattice layer of the n-type semiconductor layer 120. The light-emitting layer 130 has at least a well layer and a barrier layer. The light-emitting layer 130 preferably has a capping layer on the well layer. The light-emitting layer 130 has a multiquantum well structure or a single quantum well structure.

The p-type semiconductor layer 140 has a p-type cladding layer and a p-type contact layer. The p-type cladding layer is a layer for confining electrons into the light-emitting layer 130. The p-type cladding layer is formed on the light-emitting layer 130. The p-type contact layer is a semiconductor layer electrically connected to the p-electrode P1. Actually, the p-type contact layer is in contact with the transparent electrode TE1. The p-type contact layer is formed on the p-type cladding layer. The p-type semiconductor layer 140 may include an ud-GaN layer not doped with an acceptor.

The transparent electrode TE1 is a transparent conductive film. The transparent electrode TE1 is formed on the p-type contact layer of the p-type semiconductor layer 140. The transparent electrode TE1 is electrically connected to the p-electrode P1. The transparent electrode TE1 is preferably made of any one of ITO, IZO, ICO, ZnO, $TiO_2$, $NbTiO_2$, $TaTiO_2$, and $SnO_2$.

The reflection film Rf1 is a layer for reflecting light traveling from the light-emitting layer 130 toward the electrode. Thus, the reflected light is directed to the light extraction surface 111 of the substrate 110. The reflection film Rf1 is formed on the transparent electrode TE1. The reflection film Rf1 is made of a metal having a high reflectivity, for example, Al and Ag.

The p-electrode P1 is formed on the reflection film Rf1. The p-electrode P1 is electrically connected to the p-type contact layer through the transparent electrode TE1. The p-electrode P1 is made of metal. The p-electrode P1 is formed, for example, by depositing Ni and Au in order on the reflection film Rf1 side. The p-electrode P1 may have the same deposition structure as that of the n-electrode N1.

The n-electrode N1 is formed on the n-type contact layer of the n-type semiconductor layer 120. The n-electrode N1 is made of metal. The n-electrode N1 is formed, for example, by depositing Ti and Al in order on the n-type contact layer side. Alternatively, the n-electrode N1 may be formed, for example, by depositing V and Al in order on the n-type contact layer side.

The light-emitting device 100 may have a current blocking layer between the p-type contact layer of the p-type semiconductor layer 140 and the transparent electrode TE1. The light-emitting device 100 may have an insulating film.

The p-electrode P1 may have a p-pad electrode, a plurality of p-contact electrodes in contact with the transparent electrode TE1, and a p-wiring electrode connecting the p-pad electrode and the p-contact electrodes. The n-electrode N1 may have an n-pad electrode, a plurality of n-contact electrodes in contact with the n-type contact layer of the n-type semiconductor layer 120, and an n-wiring electrode connecting the n-pad electrode and the n-contact electrodes.

2. Light Extraction Surface of Substrate

Figure 2:
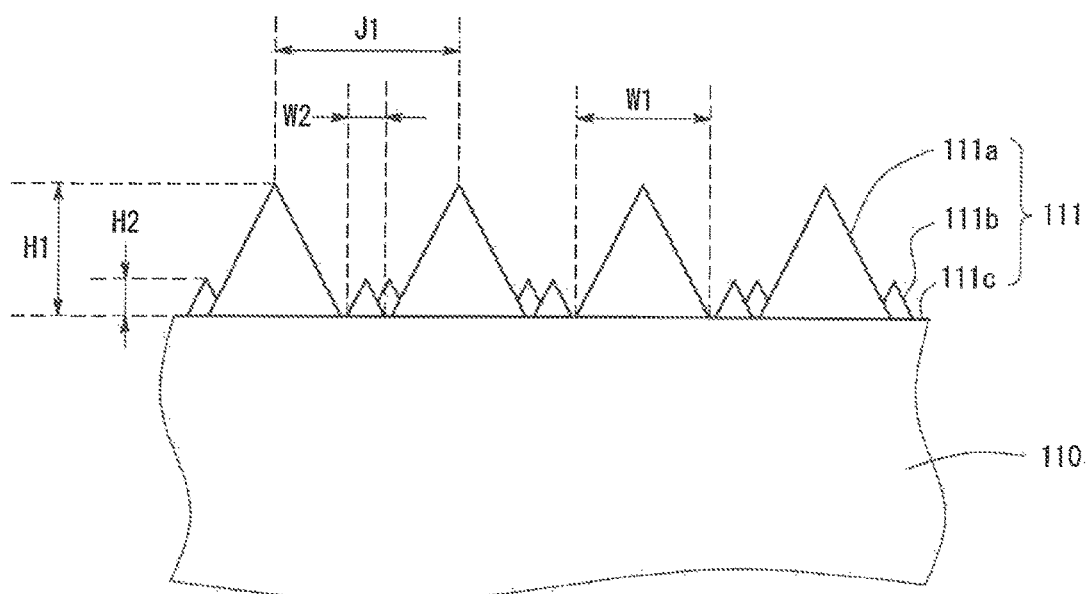
FIG. 2 is a sketch showing a light extraction surface of a substrate of the light-emitting device according to Embodiment 1.

FIG. 2 is an enlarged cross-sectional view of a periphery of light extraction surface 111 of the substrate 110. As shown in FIG. 2, the light extraction surface 111 of the substrate 110 has a plurality of first protrusions 111a, a plurality of second protrusions 111b, and a bottom surface 111c. The first protrusions 111a and the second protrusions 111b are formed on the bottom surface 111c. The first protrusions 111a are regularly arranged. The second protrusions 111b are randomly arranged. Actually, the area of the bottom surface 111c having no protrusions and recesses is extremely small.

The first protrusions 111a are formed at a pitch J1 of 350 nm to 550 nm. The height H1 of the first protrusions 111a is 200 nm to 400 nm. The diameter W1 of the first protrusions 111a at the bottom surface thereof is 150 nm to 350 nm. The height H2 of the second protrusions 111b is 100 nm to 300 nm. The diameter W2 of the second protrusions 111b at the bottom surface thereof is 100 nm to 300 nm. These numerical value ranges are merely examples. Therefore, these numerical values may be any value other than the above. However, the height of the first protrusion 111a is larger than the height of the second protrusion 111b.

Figure 3:
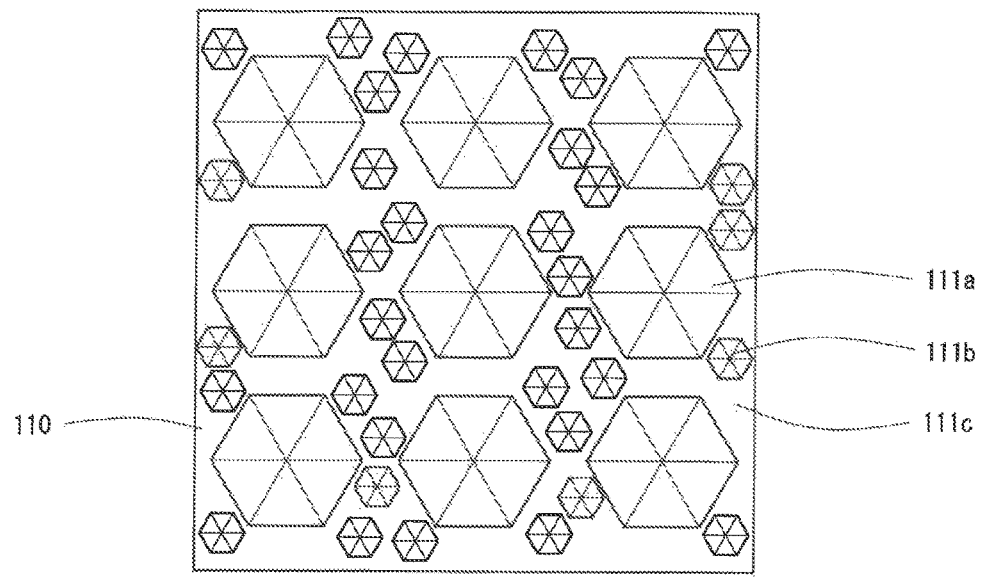
FIG. 3 is a plan view showing the light extraction surface of the substrate of the light-emitting device according to Embodiment 1.

FIG. 3 is a plan view of the substrate 110 as viewed from the light extraction surface 111. As shown in FIG. 3, each of the first protrusions 111a has a hexagonal pyramid shape. Each of the second protrusions 111b has also a hexagonal pyramid shape. Therefore, the diameter W1 of the first protrusions 111a and the diameter W2 of the second protrusions 111b are a distance between the corners facing to each other of the hexagon when viewed from above the protrusions. The area of the first protrusions 111a accounts for 50% to 85% of the total area of the nitrogen surface of the substrate 110. In this case, the light extraction efficiency from the light extraction surface 111 is high. The area of the first protrusions 111a preferably accounts for 60% to 70% of the total area of the nitrogen surface of the substrate 110.

3. Method for Forming an Uneven Shape on a Substrate

The method for forming an uneven shape on the light extraction surface 111 of the substrate 110 will be described below. The forming method comprises a resist pattern formation step of forming a first resist pattern on an nitrogen surface of a transparent nitride-based substrate, a first protrusion formation step of forming a plurality of first protrusions on the nitrogen surface of the transparent nitride-based substrate, and a second protrusion formation step of forming a plurality of second protrusions on the nitrogen surface of the transparent nitride-based substrate.

Figure 4:
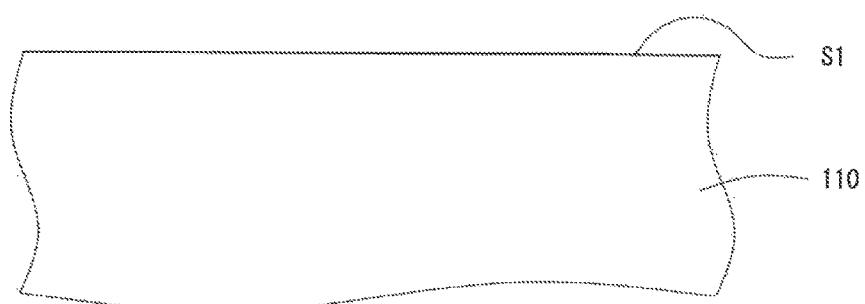
FIG. 4 is a sketch for describing a method for forming an uneven shape on the substrate of the light-emitting device according to Embodiment 1 (part 1)

FIG. 4 is a sketch showing the substrate 110 before protrusions and recesses are formed on the light extraction surface. At this stage, the substrate 110 is processed to a desired thickness.

3-1. Resist Pattern Formation Step

Figure 5:
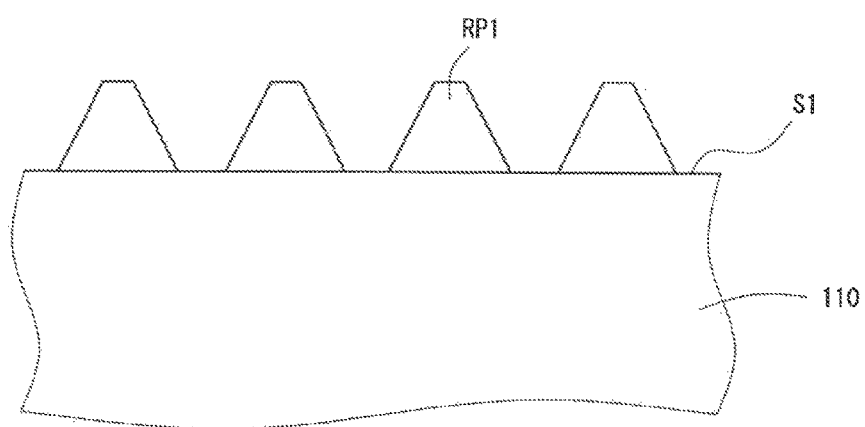
FIG. 5 is a sketch for describing the method for forming the uneven shape on the substrate of the light-emitting device according to Embodiment 1 (part 2)

As shown in FIG. 5, a resist pattern RP1 is formed on a first surface S1 of the substrate 110. The first surface S1 is the nitrogen surface, i.e., −c surface, of the transparent nitride-based substrate. The resist pattern RP1 is a first resist pattern having regularity.

3-2. First Protrusion Formation Step (Dry Etching)

Figure 6:
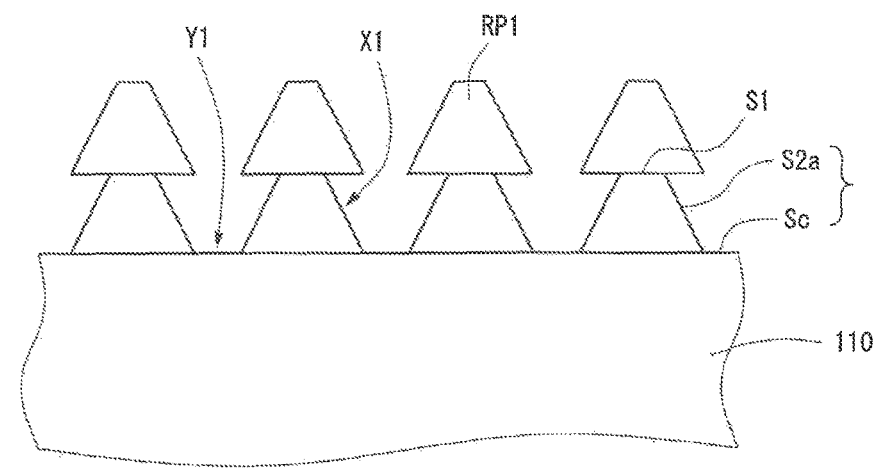
FIG. 6 is a sketch for describing the method for forming the uneven shape on the substrate of the light-emitting device according to Embodiment 1 (part 3)

As shown in FIG. 6, the first surface S1 of the substrate 110 is dry etched. Chlorine-based gas is used in dry etching. Examples include $Cl_2$, $SiCl_4$, $CCl_4$, or a mixture gas of $Cl_2$ and $SiCl_4$ is used. For example, $Cl_2$ is supplied at a flow rate of 20 sccm to 40 sccm, and $SiCl_4$ is supplied at a flow rate of 2 sccm to 4 sccm. Thus, as shown in FIG. 6, a plurality of protrusions X1 and recesses Y1 are formed on the substrate 110. Since the resist pattern RP1 has a periodic shape, the protrusions X1 and the recesses Y1 are regularly disposed at a constant pitch interval. Each of the protrusions X1 has a slope S2a. The protrusions X1 have a shape closer to a hexagonal frustum shape. Each of the recesses Y1 has a bottom surface Sc and a slope S2a. Moreover, the recesses Y1 are continuously connected via the bottom surface Sc.

Thus, the substrate 110 has a plurality of protrusions X1, and a bottom surface Sc between the protrusions X1. The resist pattern RP1 is etched to some extent by dry etching. However, it keeps regularity even after dry etching.

3-3. Second Protrusion Formation Step (Wet Etching)

Figure 7:
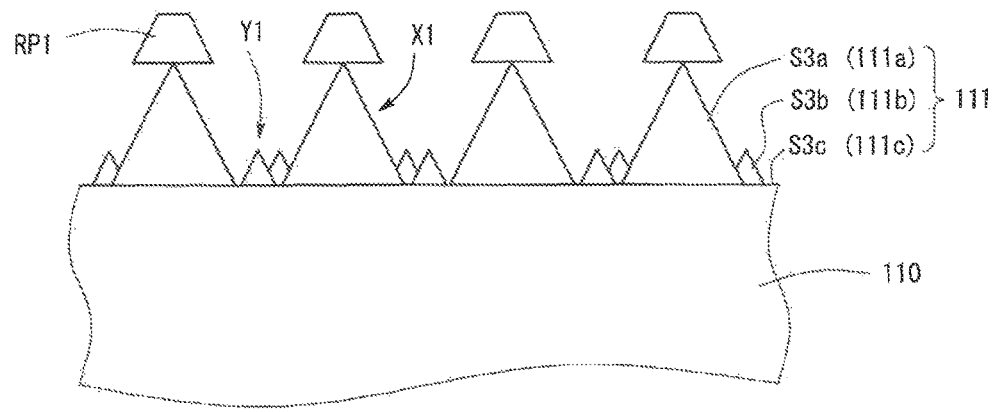
FIG. 7 is a sketch for describing the method for forming the uneven shape on the substrate of the light-emitting device according to Embodiment 1 (part 4)

As shown in FIG. 7, the nitrogen surface of the substrate 110 is wet etched. Actually, wet etching is performed on the portion exposed in the first protrusion formation step. At that time, wet etching is performed without removing the resist pattern RP1 subjected to dry etching. In wet etching, alkaline solution is used, for example, a mixed solution of TMAH and KOH. The concentration of TMAH is preferably 20% to 30%. The temperature of the mixed solution is, for example, 40° C. to 65° C. The mixed solution is preferably stirred during wet etching. Thereby, the protrusions X1 are further etched to form protrusions S1a. The bottom surface Sc is further etched to generate the protrusions S1b and the bottom surface S3c. The protrusions S1a are the first protrusions 111a. The protrusions S1b are the second protrusions 111b. The bottom surface S3c is the bottom surface 111c.

Figure 8:
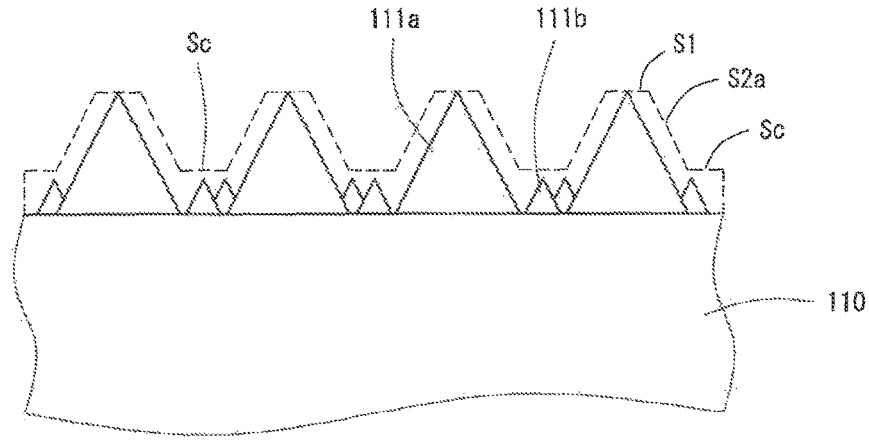
FIG. 8 is a sketch for comparing the conditions before and after wet etching in the method for forming the uneven shape on the substrate of the light-emitting device according to Embodiment 1.

FIG. 8 is a sketch for comparing the conditions before and after wet etching. A solid line of FIG. 8 indicates the substrate 110 after wet etching. A broken line of FIG. 8 indicates the substrate 110 before wet etching. The first protrusions 111a are formed at a constant pitch interval, reflecting to some extent the shape of the resist pattern RP1 formed at a constant pitch interval. On the contrary, the second protrusions 111b are randomly formed.

3-4. Resist Removal Step

Next, the resist pattern RP1 is removed by $O_2$ ashing. The remaining resist is sufficiently removed by immersing the substrate 110 in a peeling liquid at a temperature of about 120° C. Thus, since the resist is kept until two types of etching are finished, the height of all of the first protrusions 111a is kept nearly the same.

4. Method for Producing Semiconductor Light-Emitting Device

Next will be described a method for producing a light-emitting device 100 according to Embodiment 1.

4-1. Substrate Polishing Step

Firstly, the nitrogen surface of the substrate 110 of GaN is polished. This makes the thickness of the substrate 110 to 100 μm to 200 μm. At that time, an affected layer is generated on the polished surface.

4-2. Affected Layer Removal Step

Subsequently, the affected layer on the nitrogen surface of the substrate 110 is removed, for example, by dry etching. A mixture gas of $F_2$ gas and Ar gas may be used as an etching gas. Resist is not used to remove the affected layer over the entire surface of the substrate 110.

4-3. Uneven Shape Formation Step

Using the method for forming an uneven shape on the light extraction surface 111 of the substrate 110, an uneven shape is formed on the substrate 110. That is, the resist pattern formation step, the first protrusion formation step, and the second protrusion formation step are performed.

4-4. n-Type Semiconductor Layer Formation Step

Subsequently, a semiconductor layer is grown from the surface, i.e., gallium surface or +c surface, opposite to the nitrogen surface of the substrate 110. Firstly, an n-type semiconductor layer 120 is formed on the substrate 110. Crystals forming the semiconductor layers are epitaxially grown through Metal Organic Chemical Vapor Deposition (MOCVD). The carrier gas used is hydrogen ($H_2$), nitrogen ($N_2$), or a gas mixture of hydrogen and nitrogen ($H_2+N_2$). Ammonia gas ($NH_3$) is used as a nitrogen source. Trimethylgallium (Ga(CH$_3$)$_3$) is used as a Ga source. Trimethylindium (In(CH$_3$)$_3$) is used as an In source. Trimethylaluminum (Al(CH$_3$)$_3$) is used as an Al source. Silane (SiH$_4$) is used as an n-type dopant gas. Bis(cyclopentadienyl)magnesium (Mg(C$_5$H$_5$)$_2$) is used as the p-type dopant gas. Any gas other than the above may be used.

As the n-type semiconductor layer 120, an n-type contact layer, an n-side electrostatic breakdown preventing layer, and an n-side superlattice layer are formed in this order. The n-type contact layer is formed at a substrate temperature of 1,080° C. to 1,140° C. The n-side electrostatic breakdown preventing layer is formed at a substrate temperature of 750° C. to 950° C.

4-5. Light-Emitting Layer Formation Step

A light-emitting layer 130 is formed on the n-side superlattice layer of the n-type semiconductor layer 120. For that, at least one well layer and barrier layer are formed. A capping layer may be formed on the well layer.

4-6. p-Type Semiconductor Layer Formation Step

A p-type semiconductor layer 140 is formed on the light-emitting layer 130. As the p-type semiconductor layer 140, a p-type cladding layer and a p-type contact layer are formed in this order.

4-7. Transparent Electrode Formation Step

Next, a transparent electrode TE1 is formed on the p-type contact layer of the p-type semiconductor layer 140, for example, by sputtering or vapor deposition.

4-8. n-Type Semiconductor Layer Exposure Step

A groove reaching from the p-type semiconductor layer 140 to the n-type semiconductor layer 120 is formed by ICP etching. Thus, the n-type contact layer of the n-type semiconductor layer 120 is exposed on the p-type semiconductor layer 140 side. After that, the transparent electrode TE1 may be heat treated.

4-9. Reflection Film Formation Step

A reflection film Rf1 is formed on the transparent electrode TE1.

4-10. Electrode Formation Step (n-Electrode Formation Step and p-Electrode Formation Step)

Next, electrodes are formed. An n-electrode N1 is formed on the exposed n-type contact layer of the n-type semiconductor layer 120. Thus, the n-electrode N1 is in contact with the n-type contact layer of the n-type semiconductor layer 120. A p-electrode P1 is formed on the reflection film Rf1. Thus, the p-electrode P1 is electrically connected to the transparent electrode TE1. The n-electrode N1 and the p-electrode P1 may be formed in the separate steps or in the same step. In the case of the same step, the n-electrode N1 and the p-electrode P1 have the same deposition structure.

4-11. Other Steps

Other than the above steps, insulating film formation step, heat treatment step, and other steps may be appropriately performed. Through the steps described above, the light-emitting device 100 shown in FIG. 1 is produced.

5. Variation 5-1. Uneven Shape on the Substrate

Figure 9:
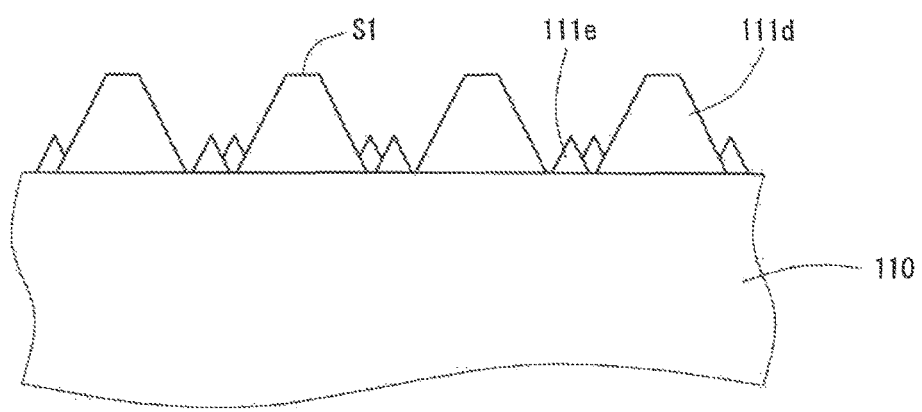
FIG. 9 is a sketch showing a light extraction surface of a substrate of a light-emitting device according to variation of Embodiment 1.

The substrate 110 may have an uneven shape shown in FIG. 9. At this time, the substrate 110 has a plurality of first protrusions 111d and a plurality of second protrusions 111e. The first surface S1 remains on the top of each first protrusion 111d. Therefore, the first protrusion 111d has a hexagonal frustum shape. To form such first protrusion 111d, the processing time may be set shorter in the second protrusion formation step (wet etching).

5-2. Shape of Semiconductor Layer Forming Surface on a Substrate

In Embodiment 1, the uneven shape is formed on the light extraction surface 111 of the substrate 110. However, the uneven shape may also be formed on the semiconductor layer forming surface opposite to the light extraction surface 111 of the substrate 110. This is because the light emitted from the light-emitting layer 130 can be suppressed from being reflected at an interface between the substrate 110 and the semiconductor layer.

5-3. First Protrusion Arrangement on a Substrate

In FIG. 3, the first protrusions 111a are disposed at the vertices of lattice pattern. However, the first protrusions 111a may be arranged in a honeycomb pattern.

5-4. Order of Production Steps

In Embodiment 1, after the light extraction surface 111 was formed on the substrate 110, the semiconductor layer is grown. However, the light extraction surface 111 may be formed after the semiconductor layer was grown on the substrate 110.

5-5. Types of Semiconductor Layers

The light-emitting device 100 according to Embodiment 1 has a Group III nitride semiconductor. However, it may have other semiconductor layer such as other Group III-V semiconductor or Group IV semiconductor. However, the substrate 110 is a transparent nitride-based substrate. The light extraction surface 111 is formed on the substrate 110.

6. Summary of the Embodiment

As described above in details, the light-emitting device 100 according to Embodiment 1 has the light extraction surface 111 on the nitrogen surface of the transparent nitride-based substrate. The light extraction surface 111 has a plurality of first protrusions 111a and a plurality of second protrusions 111b. The height of the first protrusions 111a is larger than the height of the second protrusions 111b. Therefore, a light-emitting device 100 is achieved, in which light is appropriately extracted from the light extraction surface 111.

What is claimed is:

1. A method for producing a flip-chip type semiconductor light-emitting device in which an n-electrode and a p-electrode are formed on a same side thereof, the method comprising: polishing a nitrogen surface of a substrate which is made of a transparent nitride-based semiconductor, the nitrogen surface being a light extraction surface; removing an affected layer formed on the nitrogen surface of the substrate in the polishing of the nitrogen surface by a dry etching to expose a clean nitrogen surface of the substrate; forming a first resist pattern on the clean nitrogen surface of the substrate; forming a plurality of first protrusions and a recess having a continuous flat bottom surface on the clean nitrogen surface of the substrate; and forming a plurality of second protrusions on the continuous flat bottom surface which is the clean nitrogen surface of the substrate; wherein in forming the plurality of first protrusions, the plurality of first protrusions and the continuous flat bottom surface between the plurality of first protrusions are formed by an other dry etching; in forming the plurality of second protrusions, the plurality of second protrusions having a height smaller than a height of the plurality of first protrusions are formed on the continuous flat bottom surface by wet etching without removing the first resist pattern subjected to the other dry etching.

2. The method for producing the flip-chip type semiconductor light-emitting device according to claim 1, wherein in forming the plurality of first protrusions and the recess, the plurality of first protrusions are formed at a constant pitch interval and in forming the plurality of second protrusions, the plurality of second protrusions are randomly formed.

3. The method for producing the flip-chip type semiconductor light-emitting device according to claim 1, wherein in forming the plurality of first protrusions and the recess, and forming the plurality of second protrusions, the plurality of first protrusions are formed at a pitch of 350 nm to 550 nm, the height of the plurality of first protrusions is 200 nm to 400 nm, a diameter of the plurality of first protrusions at a bottom surface thereof is 150 nm to 350 nm; and the height of the plurality of second protrusions is 100 nm to 300 nm, and a diameter of the plurality of second protrusions at a bottom surface thereof is 100 nm to 300 nm.

4. The method for producing the flip-chip type semiconductor light-emitting device according to claim 1, wherein an area of the plurality of first protrusions accounts for 50% to 85% of a total area of the nitrogen surface of the substrate.

5. The method for producing the flip-chip type semiconductor light-emitting device according to claim 1, further comprising: forming a semiconductor layer on a surface opposite to the nitrogen surface of the substrate.

6. The method for producing the flip-chip type semiconductor light-emitting device according to claim 1, wherein where the substrate is GaN.

* * * * *